(12) United States Patent
Tanaka

(10) Patent No.: US 8,502,265 B2  
(45) Date of Patent: Aug. 6, 2013

(54) LIGHT EMITTING DEVICE HAVING DIFFERENT MULTI-QUANTUM WELL MATERIALS

(75) Inventor: Akira Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 410 days.

(21) Appl. No.: 12/561,761

(22) Filed: Sep. 17, 2009

(65) Prior Publication Data

US 2010/0283035 A1     Nov. 11, 2010

(30) Foreign Application Priority Data

May 7, 2009   (JP) ................................. 2009-112741

(51) Int. Cl.
*H01L 33/00*     (2010.01)

(52) U.S. Cl.
USPC ................................ 257/103; 257/99; 438/34

(58) Field of Classification Search
USPC ...................... 257/103, 99; 438/34
See application file for complete search history.

(56) References Cited

U.S. PATENT DOCUMENTS

| | | | |
|---|---|---|---|
| 5,309,468 A | 5/1994 | Makiuchi | |
| 5,577,063 A | 11/1996 | Nagai et al. | |
| 6,936,864 B2 * | 8/2005 | Kondo | 257/103 |
| 2004/0184499 A1 | 9/2004 | Kondo | |
| 2006/0002442 A1 | 1/2006 | Haberern et al. | |
| 2006/0163586 A1 * | 7/2006 | Denbaars et al. | 257/79 |

FOREIGN PATENT DOCUMENTS

| | | |
|---|---|---|
| DE | 10245632 | 4/2004 |
| DE | 102007046519 | 4/2009 |
| JP | 61-018192 | 1/1986 |
| JP | 07-249827 | 9/1995 |
| JP | 08-125280 | 5/1996 |
| JP | 2000-200945 | 7/2000 |
| JP | 2002-151733 | 5/2002 |
| JP | 2004-193338 | 7/2004 |
| JP | 2004-247635 | 9/2004 |
| JP | 2004-363206 | 12/2004 |
| JP | 2006-156458 | 6/2006 |
| JP | 2007-258320 | 10/2007 |
| WO | 2009015386 | 1/2009 |

OTHER PUBLICATIONS

European Search Report dated Sep. 15, 2010 for European Patent Application No. 09170664.8.
Japanese Office Action for Japanese Application No. 2009-112741 mailed on Sep. 27, 2012.

\* cited by examiner

*Primary Examiner* — Julio J Maldonado
*Assistant Examiner* — Robert Bachner
(74) *Attorney, Agent, or Firm* — Turocy & Watson, LLP

(57) ABSTRACT

A light emitting device includes: an active layer including a multi-quantum well having a well layer and a barrier layer, the active layer including a non-emitting region and an emitting region formed around the non-emitting region; a first cladding layer provided on a first major surface of the active layer; a pad electrode provided above the first cladding layer so that its center is located near a center of the non-emitting region as viewed in a direction perpendicular to the first major surface; and a second cladding layer provided below a second major surface of the active layer opposite to the first major surface. A bandgap of the well layer in the non-emitting region is wider than a bandgap of the well layer in the emitting region and narrower than a bandgap of the first cladding layer.

17 Claims, 5 Drawing Sheets

FIG. 1A
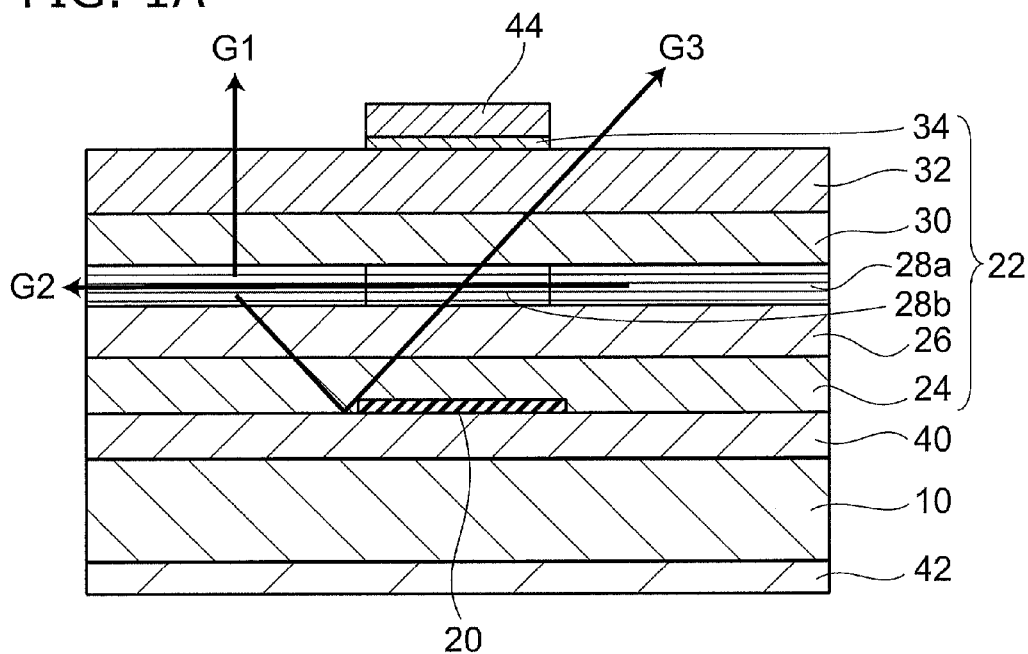
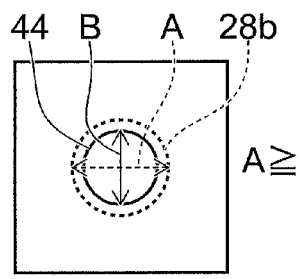
FIG. 1B
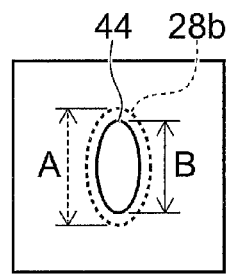
FIG. 1C
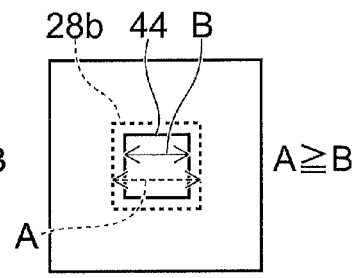
FIG. 1D
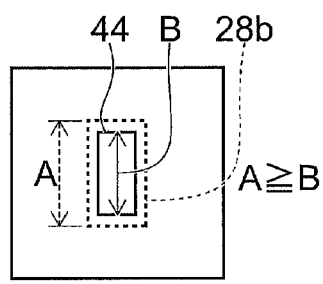
FIG. 1E
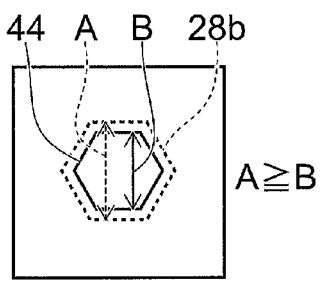
FIG. 1F

LIGHT EMITTING DEVICE HAVING DIFFERENT MULTI-QUANTUM WELL MATERIALS

CROSS-REFERENCE TO RELATED APPLICATIONS

This application is based upon and claims the benefits of priorities from the prior Japanese Patent Application No. 2009-112741, filed on May 7, 2009; the entire contents of which are incorporated herein by reference.

BACKGROUND OF THE INVENTION

1. Field of the Invention

This invention relates to a light emitting device.

2. Background Art

Demand for light emitting devices in the visible wavelength range having high brightness and high emission efficiency is growing in illumination apparatuses, display apparatuses, traffic signals and the like.

A light emitting layer made of InGaAlP-based semiconductor can emit visible light in the green to red wavelength range. A lattice constant of InGaAlP-based semiconductor has a small mismatch with a lattice constant of GaAs. Hence, a GaAs substrate is often used as a substrate for crystal growth of a multilayer body including a light emitting layer. This serves to obtain a highly reliable light emitting device with reduced crystal defects.

On the other hand, GaAs absorbs visible light, and hence tends to decrease the brightness. The multilayer body can be transferred onto a translucent substrate, or bonded to another substrate via a reflective metal layer, to reduce optical absorption in the substrate and facilitate increasing the emission efficiency. However, with the increase in the planar size of the light emitting layer, the emission efficiency decreases due to absorption of light passing through the light emitting layer.

JP-A-2004-247635 (Kokai) discloses an example of a light emitting device in which emitted light can be extracted outside with high efficiency. This example includes a selectively provided light emitting layer and a high-resistance current block layer provided around this light emitting layer. The high-resistance layer concentrates the current on the light emitting layer and increases the emission efficiency. Furthermore, the light extraction efficiency can be improved by placing the light emitting layer near the center of the light emitting device.

However, in this example, the light emitting layer having high current density is located below a pad electrode. Hence, the pad electrode blocks the emitted light, causing the problem of decreased brightness.

SUMMARY OF THE INVENTION

According to an aspect of the invention, there is provided a light emitting device, including: an active layer including a multi-quantum well having a well layer and a barrier layer, the active layer including a non-emitting region and an emitting region formed around the non-emitting region; a first cladding layer provided on a first major surface of the active layer; a pad electrode provided above the first cladding layer so that its center is located near a center of the non-emitting region as viewed in a direction perpendicular to the first major surface; and a second cladding layer provided below a second major surface of the active layer opposite to the first major surface, a bandgap of the well layer in the non-emitting region being wider than a bandgap of the well layer in the emitting region and narrower than a bandgap of the first cladding layer.

According to another aspect of the invention, there is provided a light emitting device, including: an active layer including a multi-quantum well having a well layer and a barrier layer, the active layer including a non-emitting region and an emitting region formed around the non-emitting region; a first cladding layer provided on a first major surface of the active layer; a pad electrode provided above the first cladding layer so that its center is located near a center of the non-emitting region as viewed in a direction perpendicular to the first major surface; a second cladding layer provided below a second major surface of the active layer opposite to the first major surface of the active layer; a lower surface electrode provided below the second cladding layer so that part of emitted light from the emitting region can be reflected thereby, transmitted through the non-emitting region, and emitted outside; and a substrate provided below the lower surface electrode and made of a semiconductor, a bandgap of the well layer in the non-emitting region being wider than a bandgap of the well layer in the emitting region and narrower than a bandgap of the first cladding layer.

According to another aspect of the invention, there is provided a light emitting device, including: an active layer including a multi-quantum well made of one of $In_x(Ga_yAl_{1-y})_{1-x}P$ (where $0 \leq x \leq 1$, $0 \leq y \leq 1$), $In_wGa_{1-w}As$ (where $0 \leq w \leq 1$), and $Ga_zAl_{1-z}As$ (where $0 \leq z \leq 1$), the active layer including a non-emitting region and an emitting region formed around the non-emitting region; a first cladding layer provided on a first major surface of the active layer; a pad electrode provided above the first cladding layer so that its center is located near the center of the non-emitting region as viewed in a direction perpendicular to the first major surface; a second cladding layer provided below a second major surface of the active layer opposite to the first major surface of the active layer; a lower surface electrode provided below the second cladding layer so that part of emitted light from the emitting region can be reflected thereby, transmitted through the non-emitting region, and emitted outside; and a substrate provided below the lower surface electrode and made of a semiconductor, a bandgap of a well layer of the multi-quantum well in the non-emitting region being wider than a bandgap of a well layer of the multi-quantum well in the emitting region and narrower than a bandgap of the first cladding layer.

BRIEF DESCRIPTION OF THE DRAWINGS

FIG. 1 is a schematic cross-sectional view of a light emitting element according to a first embodiment;

DETAILED DESCRIPTION OF THE INVENTION

Figure 2A:
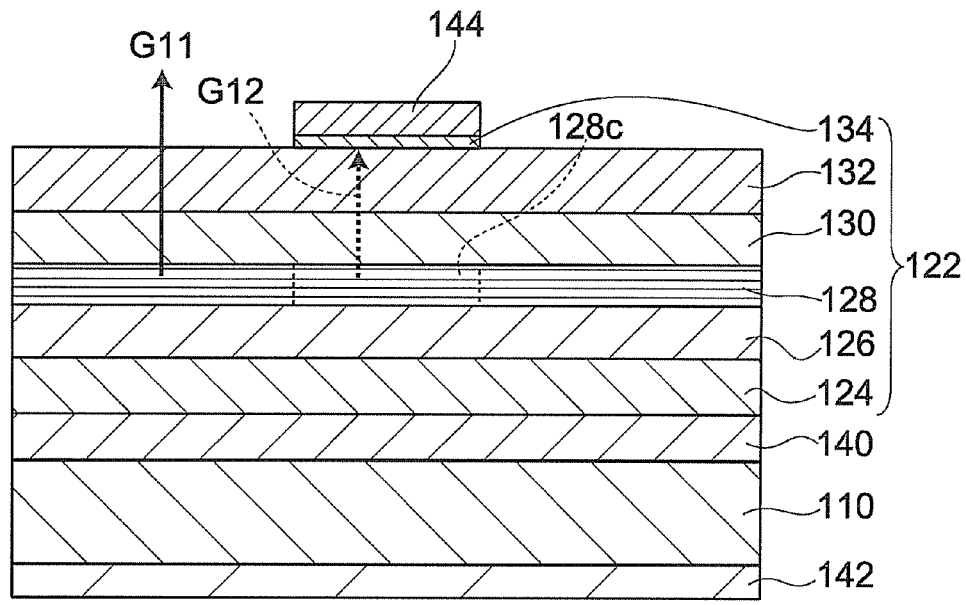
FIGS. 2A and 2B are schematic cross-sectional views of a comparative example.

Embodiments of the invention will now be described with reference to the drawings.

FIG. 1 is a schematic cross-sectional view of a light emitting device according to a first embodiment of the invention.

The light emitting device includes a multilayer body 22 made of semiconductor and including an active layer 28, a substrate 10 to which the multilayer body 22 is bonded via a lower surface electrode 40, and a pad electrode 44.

The multilayer body 22 includes an n-type current diffusion layer 24, an n-type cladding layer 26, an active layer 28, a p-type cladding layer 30, a p-type current diffusion layer 32, and a contact layer 34 from the side of the lower surface electrode 40 serving as an n-side electrode. The multilayer body 22 can include InGaAlP, GaAs and the like to emit light in green to red wavelength range.

This multilayer body 22 can be formed on a GaAs or other substrate (not shown) by the MOCVD (metal organic chemical vapor deposition) method to achieve high crystal quality.

In this specification, "InGaAlP" refers to a material represented by a composition formula $In_x(Ga_yAl_{1-y})_{1-x}P$ (where $0 \leq x \leq 1$, $0 \leq y \leq 1$), and also includes those doped with p-type or n-type impurities.

Next, an example composition of the multilayer body 22 is described. The n-type current diffusion layer 24 is made of $In_{0.5}(Ga_{0.3}Al_{0.7})_{0.5}P$ and illustratively has a carrier concentration of $4 \times 10^{17}$ cm$^{-3}$ and a thickness of 2 μm. The n-type cladding layer 26 is made of InAlP and illustratively has a carrier concentration of $4 \times 10^{17}$ cm$^{-3}$ and a thickness of 0.6 μm. The p-type cladding layer 30 is made of InAlP and illustratively has a carrier concentration of $2 \times 10^{17}$ cm$^{-3}$ and a thickness of 0.6 μm. Here, the conductivity type is not limited thereto, but can be the opposite conductivity type.

The substrate 10 is illustratively made of conductive Si. A metal layer provided on the surface thereof and a metal layer provided on the multilayer body 22 are joined together in the wafer state and subjected to heat bonding. The metal layers are bonded into a lower surface electrode 40, and hence the bonding strength between the multilayer body 22 and the substrate 10 is increased. Thus, the crystal growth substrate can be removed. A substrate electrode 42 is formed on a backside of the substrate 10.

The active layer 28 has an MQW (multi-quantum well) structure in which well layers illustratively made of $In_{0.5}(Ga_{0.94}Al_{0.06})_{0.5}P$ and barrier layers illustratively made of $In_{0.5}(Ga_{0.4}Al_{0.6})_{0.5}P$ are alternately arranged, and includes an emitting region 28a and a non-emitting region 28b. For instance, the well layer has a width of 10 nm, and the barrier layer has a width of 20 nm. Furthermore, the active layer 28 is undoped or low doped.

The non-emitting region 28b is provided below the pad electrode 44 so that its center is generally aligned with a center of the pad electrode 44 as viewed from above, that is, in a direction perpendicular to a first major surface of the active layer 28. Furthermore, the non-emitting region 28b has generally the same planar size as the pad electrode 44. Here, a planar size of the non-emitting region 28b can be smaller than a planar size of the pad electrode 44, but preferably, it is large enough to externally extract the light reflected by the lower surface electrode 40, because this can improve the light extraction efficiency.

A current injected from the pad electrode 44 flows into the emitting region 28a provided around the non-emitting region 28b, and causes emission of light with a wavelength corresponding to a bandgap wavelength of the well layer in the emitting region 28a. This layout of the emitting region 28a reduces the amount of light blocked by the pad electrode 44, and upward directed light G1 is emitted. Laterally directed light G2 is emitted directly, or through the non-emitting region 28b, from the emitting region 28a. Furthermore, downward directed light is reflected by the lower surface electrode 40. Part of the reflected light G3 passes through the non-emitting region 28b and is emitted outside.

As described later, in this embodiment, the non-emitting region 28b has a wider bandgap than the emitting region 28a. This can prevent current injection into the non-emitting region 28b and reduce the non-effective current which does not contribute to the emitted light. Furthermore, the non-emitting region 28b has lower optical absorption than the emitting region 28a. That is, the non-emitting region 28b acts as a transparent region for the wavelength of the light emitted in accordance with the bandgap of the emitting region 28a. In this transparent region, optical absorption of the lateral light G2 and reflected light G3 is reduced, which facilitates increasing the light extraction efficiency.

Furthermore, a current block layer 20 made of $SiO_2$ or other dielectric film can be provided between the lower surface electrode 40 and the n-type current diffusion layer 24 to further reduce the injection current from the pad electrode 44 into the non-emitting region 28b. Thus, the non-effective current is reduced, which is more advantageous. Here, use of the dielectric film capable of transmitting the emitted light, such as $SiO_2$, is more advantageous because the light transmitted through the dielectric film, reflected by the lower surface electrode 40, and transmitted again through the dielectric film can be emitted outside through the non-emitting region 28b.

The current block layer 20 can be located anywhere between the pad electrode 44 and the lower surface electrode 40. For instance, a current block layer 20 having a smaller planar size than the pad electrode 44 can be provided between the pad electrode 44 and the contact layer 34.

Alternatively, the multilayer body 22 can be made of $Ga_xAl_{1-x}As$ ($0 \leq x \leq 1$). In this case, the MQW structure of the active layer 28 is illustratively composed of well layers made of GaAlAs or GaAs and barrier layers made of GaAlAs. Furthermore, the multilayer body 22 can include an active layer 28 made of $In_wGa_{1-w}As$ ($0 \leq w \leq 1$).

Furthermore, the multilayer body 22 can be made of InGaAlN-based materials. In this specification, "InGaAlN" refers to a material represented by a composition formula $B_xIn_yGa_zAl_{1-x-y-z}N$ (where $0 \leq x \leq 1$, $0 \leq y \leq 1$, $0 \leq z \leq 1$, $x+y+z \leq 1$), and also includes those doped with p-type or n-type impurities. In this case, the multilayer body 22 illustratively includes an n-type cladding layer 26 made of $Al_{0.2}Ga_{0.8}N$, an active layer 28 of the MQW structure made of $In_{0.2}Ga_{0.8}N$ (well layer)/$In_{0.05}Ga_{0.95}N$ (barrier layer), a p-type cladding layer 30 made of $Al_{0.2}Ga_{0.8}N$, a contact layer 34 made of p-type GaN and the like. Alternatively, the well layer can be made of InGaAlN, and the barrier layer can be made of one of InGaAlN and GaN. The multilayer body 22 including InGaAlN-based materials can emit light in violet to green wavelength range including blue. In particular, short-wavelength light from violet to blue can be emitted with high efficiency.

Figure 2B:
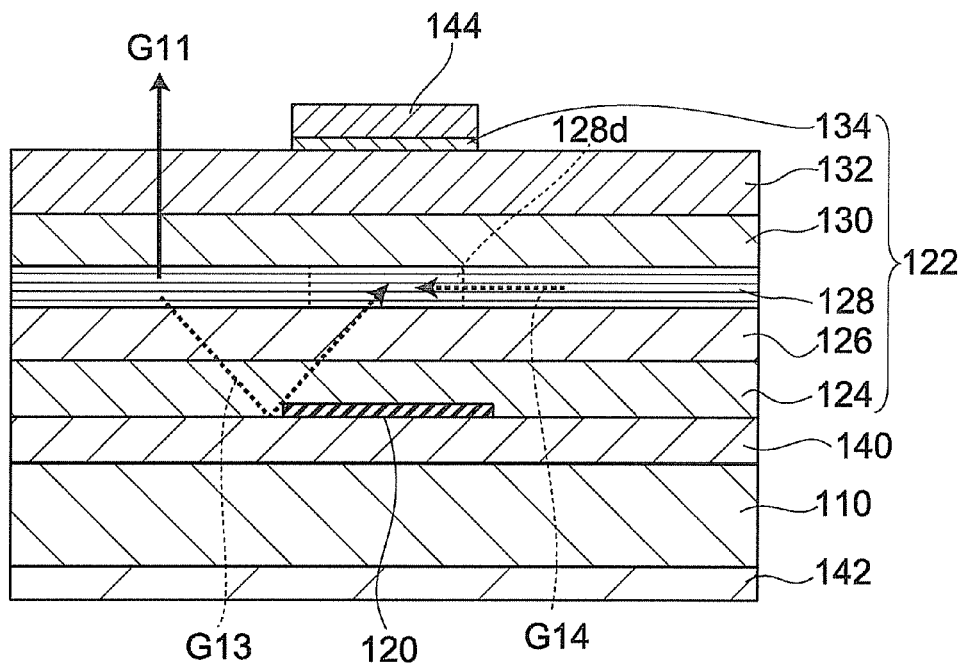

FIG. 2A is a schematic cross-sectional view showing light blocking in a comparative example, and FIG. 2B is a schematic cross-sectional view showing optical absorption in the comparative example.

The multilayer body 122 illustratively made InGaAlP or GaAs includes an n-type current diffusion layer 124, an n-type cladding layer 126, an active layer 128, a p-type cladding layer 130, a p-type current diffusion layer 132, and a contact layer 134 from the side of a lower surface electrode 140 serving as an n-side electrode. The multilayer body 122 is bonded to one surface of a substrate 110 via the lower surface electrode 140, and a substrate electrode 142 is formed on the other surface of the substrate 110.

In FIG. 2A, the active layer 128 is entirely uniform in composition. An injection current density in a light blocking region 128c below a pad electrode 144 is higher than the current density therearound. Hence, the light blocking region 128c has high optical output, but a light G12 blocked by the pad electrode 144 is difficult to extract outside, which decreases the light extraction efficiency.

In FIG. 2B, a current block layer 120 illustratively made of a dielectric film can be provided between the n-type current diffusion layer 124 and the lower surface electrode 140 to reduce current injection to immediately below the pad electrode 144. However, the optical absorptance is generally uniform throughout the active layer 128. Hence, the immediately underlying region of the pad electrode 144 acts as an absorbing region 128d, which partly absorbs a lateral light G14 from the emitting region 128a and a reflected light G13 reflected by the lower surface electrode 140 and decreases the light extraction efficiency.

In contrast, in this embodiment, the bandgap is varied in the active layer 28 so that the active layer 28 functions as an emitting region 28a or a non-emitting region 28b. More specifically, by the configuration described below, the bandgap of the well layer in the non-emitting region 28b can be controlled to be wider than the bandgap of the well layer in the emitting region 28a.

Figure 3A:
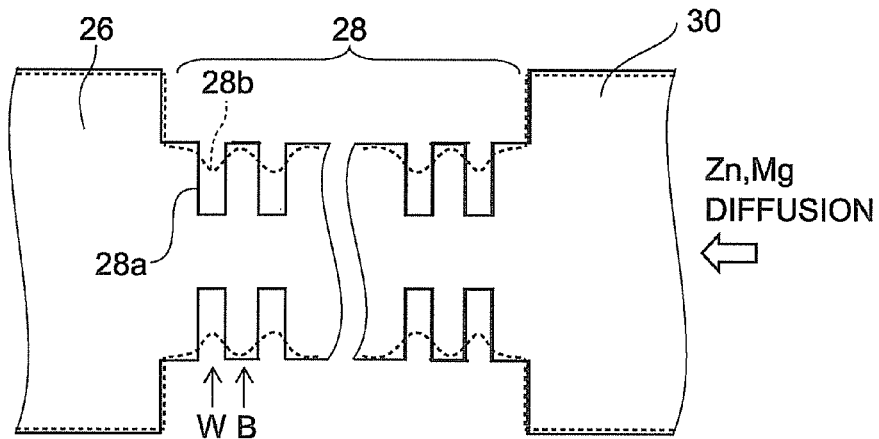
FIGS. 3A to 3C are energy band diagrams.
Figure 3B:
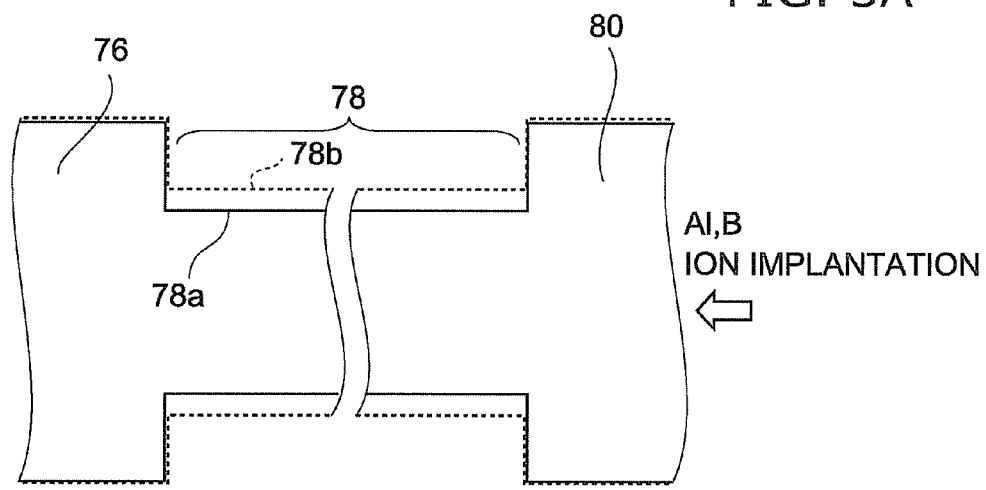
Figure 3C:
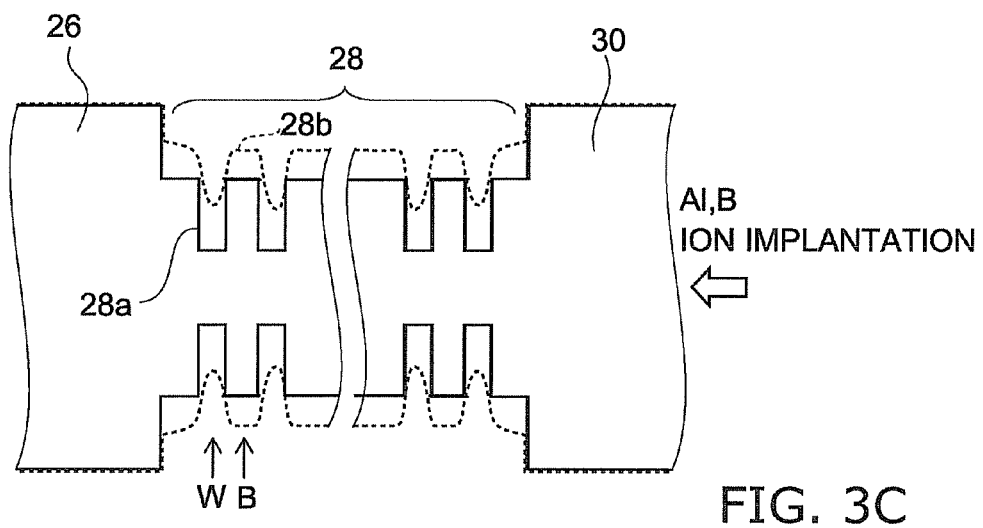

FIG. 3A is an energy band diagram resulting from a diffusion process, and FIGS. 3B and 3C are energy band diagrams resulting from ion implantation.

The active layer 28 of the MQW structure is turned to undoped or low doped p-type after crystal growth.

FIG. 3A is an energy band diagram in which an acceptor, such as Zn and Mg, is diffused into the MQW structure made of InGaAlP. When the acceptor, such as Zn and Mg, is additionally diffused into the active layer 28, the MQW structure is disordered. If the composition of the well layer W is selected to be the composition as described above, the bandgap near the well layer W with the acceptor introduced therein can be widened as indicated by the dotted line. On the other hand, variation in the energy band is small in the emitting region 28a, where Zn or Mg is not diffused.

In this case, in diffusing Zn or Mg, preferably, a diffusion mask layer is provided on a region intended for the emitting region 28a so as to prevent the acceptor from being diffused therein, and the acceptor is diffused into a region intended for the non-emitting region 28b from the p-type cladding layer 30 side.

The p-type cladding layer 30 and the n-type cladding layer 26 are designed to have a wide bandgap in order to efficiently confine carriers in the active layer 28 to increase the emission efficiency. More specifically, the well layer W before disordering has a bandgap of generally 1.91 eV, whereas the cladding layer 26, 30 has a bandgap of generally 2.4 eV. Here, the refractive index of the cladding layer 26, 30 having a wide bandgap can be made smaller than the refractive index of the active layer 28. This facilitates controlling the spread of emitted light in the vertical direction of the multilayer body 22. Furthermore, if the barrier layer B has a bandgap of generally 2.2 eV, it is easy to efficiently confine carriers in the well layer W. Thus, in this embodiment, the bandgap of the well layer W in the non-emitting region 28b is narrower than each bandgap of the n-type cladding layer 26 and the p-type cladding layer 30, and wider than the bandgap of the well layer W in the emitting region 28a.

FIG. 3B is an energy band diagram in which Al or B is ion-implanted into a bulk active layer made of InGaAlN-based materials. GaN has a bandgap of generally 3.4 eV. In contrast, materials containing Al or B have a wider bandgap, such as generally 5.9 eV for AlN, 3.4-5.9 eV for AlGaN, and 8.0 eV for BN. Also in the InGaAlN-based materials with Al or B ion-implanted therein, the disordered bulk layer has a wider bandgap as shown in FIG. 3B.

Furthermore, FIG. 3C is an energy band diagram in which Al or B is ion-implanted into an InGaAlN-based MQW structure. The solid line indicates the energy band before ion implantation. In the MQW structure disordered by ion implantation, the well layer W and the barrier layer B have a wider bandgap as indicated by the dotted line. Here, although the bandgap of the barrier layer B is also widened, it is unnecessary to widen it to generally 2.2 eV, which is the bandgap of the n-type cladding layer 26 and the p-type cladding layer 30. Thus, the emitting region 28a has an energy band as indicated by the solid line, and the non-emitting region 28b has an energy band as indicated by the dotted line.

In this case, a photoresist film or dielectric film is patterned on a region intended for the emitting region 28a and used as a mask for ion implantation. Subsequently, by performing an annealing process in a suitable condition, a non-emitting region 28b is formed.

Figure 4A:
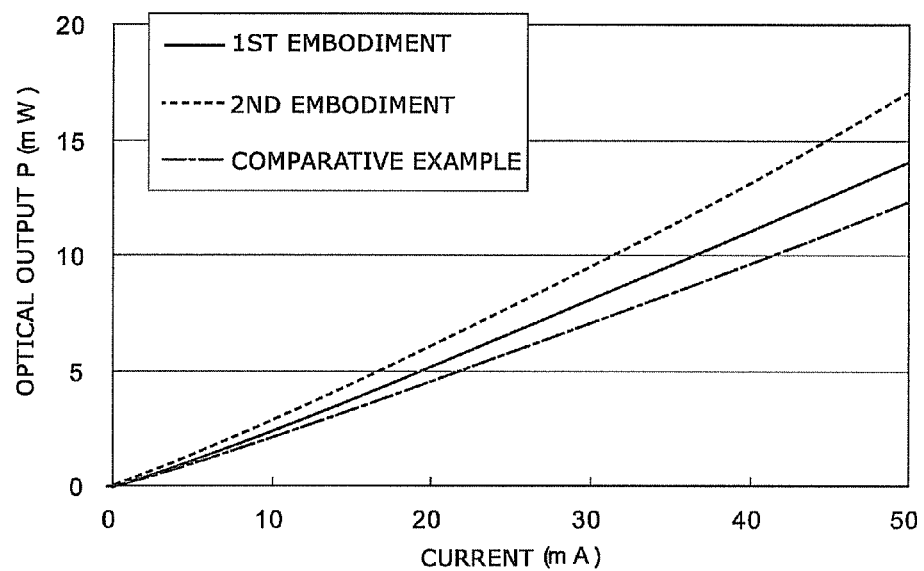
FIGS. 4A and 4B are graphs showing optical characteristics.
Figure 4B:
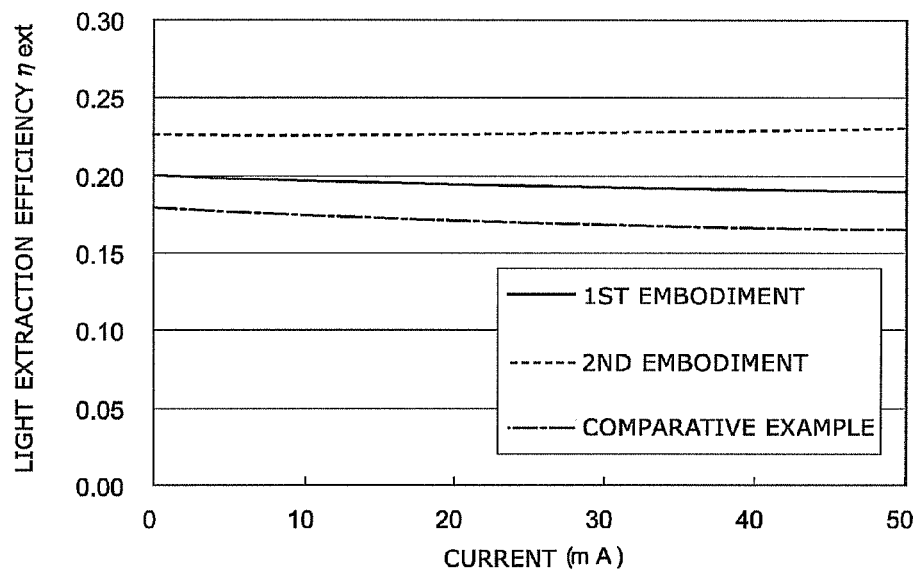

FIG. 4A is a graph showing simulated characteristics of optical output, and FIG. 4B is a graph showing simulated characteristics of light extraction efficiency.

In the first embodiment indicated by the solid line, the pad electrode 44 is shaped like a circle having a diameter of 100 µm, the non-emitting region 28b is shaped like a circle having a diameter of 100 µm, and the current block layer 20 is shaped like a circle having a diameter of 140 µm. The light emitting device is assumed to emit red light. The comparative example indicated by the dot-dashed line has the structure shown in FIG. 2B, where the pad electrode 144 is shaped like a circle having a diameter of 100 µm, and the current block layer 120 is shaped like a circle having a diameter of 140 µm.

The planar shape of the non-emitting region 28b, the pad electrode 44, and the current block layer 20 is not limited to a circle (FIG. 1B), but can be a square (FIG. 1D), rectangle (FIG. 1E), ellipse (FIG. 1C), polygon (FIG. 1F), and the like in plan views.

Furthermore, a second non-emitting region can be provided so as to further surround the emitting region 28a provided around the non-emitting region 28b at the center.

At a current of 50 mA, the optical output P of the comparative example is generally 12 mW, whereas the optical output P of the first embodiment is as high as generally 14 mW. Furthermore, at a current of 50 mA, the light extraction efficiency $\eta_{ext}$ of the comparative example is generally 17%, whereas the light extraction efficiency $\eta_{ext}$ of the first embodiment is as high as generally 19%. Thus, the optical output and light extraction efficiency can be increased in the first embodiment.

Figure 5:
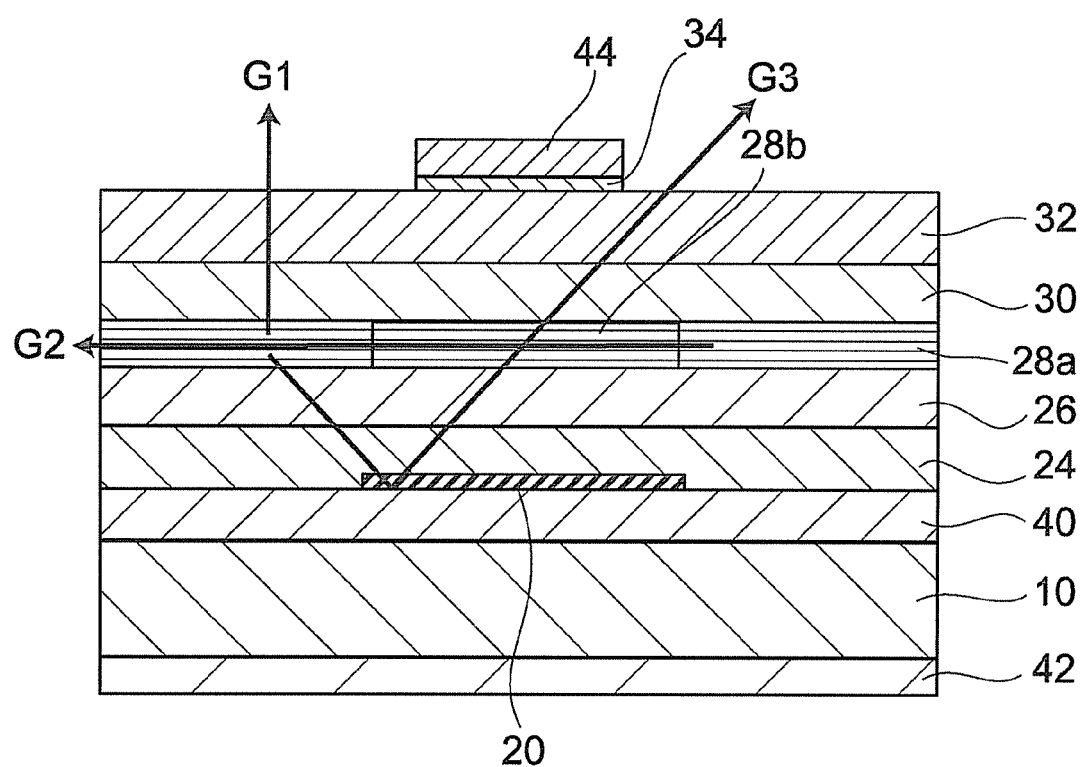
FIG. 5 is a schematic cross-sectional view of a light emitting element according to a second embodiment.

FIG. 5 is a schematic cross-sectional view of a light emitting device according to a second embodiment.

In the second embodiment, the pad electrode 44 is shaped like a circle having a diameter of 100 µm, the non-emitting region 28b is shaped like a circle having a diameter of 140 µm, and the current block layer 20 is shaped like a circle having a diameter of 140 µm.

The light emitting device is assumed to emit red light.

The optical output P in this case is indicated by the dashed line in FIG. 4A. At a current of 50 mA, the optical output P of the comparative example is generally 12 mW, whereas the optical output P of the second embodiment is as high as generally 17 mW. Furthermore, the light extraction efficiency $\eta_{ext}$ is indicated by the dashed line in FIG. 4B. At a current of 50 mA, the light extraction efficiency $\eta_{ext}$ of the comparative example is generally 17%, whereas the light extraction efficiency $\eta_{ext}$ of the second embodiment is as high as generally 23%. Thus, if the emitting region 28a is located outside the pad electrode 44 as viewed from above, light blocked by the pad electrode 44 can be further reduced, which facilitates further increasing the optical output and light extraction efficiency.

When the non-emitting region 28b is formed by diffusion of Zn or Mg, or by ion implantation of Al or B and annealing, a transition region with the bandgap gradually varied occurs at the interface with the emitting region 28a. In this specification, the position of the interface is defined as the position where the bandgap is an average of the bandgap of the emitting region 28a and the bandgap of the non-emitting region 28b.

The first and second embodiments provide a light emitting device which can improve the optical output and light extraction efficiency while reducing optical absorption in the active layer. The high-brightness light emitting device thus obtained can be widely used in such applications as illumination apparatuses, display apparatuses, and traffic signals.

The embodiments of the invention have been described with reference to the drawings. However, the invention is not limited to these embodiments. Those skilled in the art can variously modify the material, size, shape, layout and the like of the multilayer body, MQW, well layer, barrier layer, substrate, pad electrode, lower surface electrode, current block layer, substrate backside electrode and the like constituting the light emitting device, and such modifications are also encompassed within the scope of the invention unless they depart from the spirit of the invention.

The invention claimed is:

1. A light emitting device comprising:
    an active layer including a non-light emitting region and a light emitting region provided around the non-light emitting region, the non-light emitting region including a multi-quantum well having a well layer and a barrier layer, the light emitting region including a multi-quantum well having a well layer and a barrier layer;
    a first cladding layer provided on a first major surface of the active layer;
    a pad electrode provided above the first cladding layer so that its center is located near a center of the non-light emitting region as viewed in a direction perpendicular to the first major surface, a planar size of the pad electrode being equal to or smaller than a size of the non-light emitting region;
    a second cladding layer provided below a second major surface of the active layer opposite to the first major surface of the active layer;
    a lower current block layer provided below the second cladding layer;
    a substrate made of a semiconductor;
    a lower surface electrode having a first layer and a second layer, the first layer being provided below the lower current block layer and the second cladding layer, the second layer being provided on the substrate, the first layer and the second layer being bonded;
    a bandgap of the well layer in the non-light emitting region being wider than a bandgap of the well layer in the light emitting region and narrower than a bandgap of the first cladding layer;
    no part of any of the light emitting region being provided below the pad electrode;
    the first layer of the lower surface electrode reflecting parts of lights from the light emitting region, and
    the parts of light being transmitted through the non-light emitting region and emitted outward.

2. The light emitting device according to claim 1, wherein the substrate is made of conductive Si.

3. The light emitting device according to claim 1, further comprising:
    an upper current diffusion layer provided between the first cladding layer and the pad electrode.

4. The light emitting device according to claim 3, further comprising:
    an upper current block layer provided between the pad electrode and the first current diffusion layer, having a smaller planar size than the pad electrode, and made of a dielectric film.

5. The light emitting device according to claim 1, further comprising:
    A lower current diffusion layer provided below the second cladding layer, and above the lower surface electrode and the lower current block layer.

6. The light emitting device according to claim 1, wherein the lower current block layer is made of a dielectric film.

7. A light emitting device comprising:
    an active layer including a non-light emitting region and a light emitting region provided around the non-emitting region, the non-light emitting region including a first multi-quantum well having a well layer and a barrier layer, the light emitting region including a second multi-quantum well having a well layer and a barrier layer, the first and second multi-quantum wells being made of one of $In_x(Ga_yAl_{1-y})_{1-x}P$ (where $0 \leq x \leq 1$, $0 \leq y \leq 1$), $In_wGa_{1-w}As$ (where $0 \leq w \leq 1$), and $Ga_zAl_{1-z}As$ (where $0 \leq z \leq 1$);
    a first cladding layer provided on a first major surface of the active layer;
    a pad electrode provided above the first cladding layer so that its center is located near a center of the non-light emitting region as viewed in a direction perpendicular to the first major surface, a planar size of the pad electrode being equal to or smaller than a size of the non-light emitting region;
    a second cladding layer provided below a second major surface of the active layer opposite to the first major surface of the active layer;
    a lower current block layer provided below the second cladding layer;
    a substrate made of a semiconductor;
    a lower surface electrode having a first layer and a second layer, the first layer being provided below the lower current block layer and the second cladding layer, the second layer being provided on the substrate, the first layer and the second layer being bonded;
    a bandgap of the well layer in the non-light emitting region being wider than a bandgap of the well layer in the light emitting region and narrower than a bandgap of the first cladding layer;
    no part of any the light emitting region being provided below the pad electrode;
    the first layer of the lower surface electrode reflecting parts of lights from the light emitting region; and
    the parts of light being transmitted through the non-light emitting region and emitted outward.

8. The light emitting device according to claim 7, wherein the substrate is made of conductive Si.

9. The light emitting device according to claim 7, wherein the well layer in the non-emitting region is disordered by an acceptor dopant.

10. The light emitting device according to claim 6, wherein the active layer is made of InxGayAl1-x-yN (where $0 \leq x \leq 1$, $0 \leq y \leq 1$, $x+y \leq 1$).

11. The light emitting device according to claim 10, wherein the well layer in the non-emitting region is disordered by ion implantation of Al or B.

12. The light emitting device according to claim 1, wherein a planer size of the lower current block layer is larger than the planer size of the pad electrode.

13. The light emitting device according to claim 7, further comprising:
   an upper current diffusion layer provided between the first cladding layer and the pad electrode.

14. The light emitting device according to claim 13, further comprising:
   an upper current block layer provided between the pad electrode and the first current diffusion layer, having a smaller planer size than the pad electrode, and made of a dielectric film.

15. The light emitting device according to claim 7, further comprising:
   a lower current diffusion layer provided below the second cladding layer, and above the lower surface electrode and the lower current block layer.

16. The light emitting device according to claim 7, wherein the upper current block layer made of a dielectric film.

17. The light emitting device according to claim 7, wherein a planer size of the lower current block layer is larger than the planer size of the pad electrode.

\* \* \* \* \*